(12) United States Patent
Sun et al.

(10) Patent No.: US 12,322,711 B2
(45) Date of Patent: Jun. 3, 2025

(54) DIE SEAL RING STRUCTURE

(71) Applicant: UNITED MICROELECTRONICS CORP., Hsin-Chu (TW)

(72) Inventors: Chia-Chen Sun, Kaohsiung (TW); En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 107 days.

(21) Appl. No.: 17/691,130

(22) Filed: Mar. 10, 2022

(65) Prior Publication Data

US 2023/0260930 A1    Aug. 17, 2023

(30) Foreign Application Priority Data

Feb. 11, 2022    (CN) .......................... 202210128113.4

(51) Int. Cl.
*H01L 23/00*     (2006.01)
*H01L 23/58*     (2006.01)

(52) U.S. Cl.
CPC .......... *H01L 23/562* (2013.01); *H01L 23/585* (2013.01)

(58) Field of Classification Search
CPC ........................... H01L 23/562; H01L 23/585
See application file for complete search history.

(56) References Cited

U.S. PATENT DOCUMENTS

| 5,834,829 | A | * | 11/1998 | Dinkel | H01L 21/78 |
| | | | | | 257/508 |
| 7,279,775 | B2 | | 10/2007 | Kim et al. | |
| 7,777,304 | B2 | * | 8/2010 | Hamatani | H01L 23/562 |
| | | | | | 257/E21.599 |
| 2005/0087878 | A1 | * | 4/2005 | Uesugi | H01L 23/585 |
| | | | | | 257/E23.002 |
| 2007/0102791 | A1 | | 5/2007 | Wu | |
| 2008/0157285 | A1 | * | 7/2008 | Tokitoh | H01L 23/53238 |
| | | | | | 257/E23.141 |
| 2012/0313094 | A1 | * | 12/2012 | Kato | H01L 23/585 |
| | | | | | 257/E21.531 |
| 2020/0219826 | A1 | * | 7/2020 | Wu | H01L 23/5386 |
| 2021/0348684 | A1 | * | 11/2021 | Yao | H01L 23/562 |

FOREIGN PATENT DOCUMENTS

TW              202042097         11/2020

* cited by examiner

*Primary Examiner* — Peniel M Gumedzoe
(74) *Attorney, Agent, or Firm* — Winston Hsu

(57) ABSTRACT

A die seal ring structure includes a metal interconnect structure on a substrate, in which the metal interconnect structure includes an inter-metal dielectric (IMD) layer on the substrate and a first metal interconnection disposed in the IMD layer. Preferably, a first side of the first metal interconnection includes a comb-shape portion in a top view, a second side of the first metal interconnection includes a linear line, a third side of the first metal interconnection includes a linear line, and a fourth side of the first metal interconnection includes a linear line.

6 Claims, 5 Drawing Sheets

DIE SEAL RING STRUCTURE

BACKGROUND OF THE INVENTION

1. Field of the Invention

The invention relates to a die seal ring structure, and more particularly to a die seal ring structure having comb-shape portion.

2. Description of the Prior Art

Die seal ring is typically disposed between scribe line and integrated circuits of each die and formed by alternately stacking a plurality of dielectric layers and a plurality of metal layers, in which the metal layers are connected to each other through conductive vias in the dielectric layers. When a dicing process is conducted along the scribe line, the die seal ring could be used to prevent issue such as stress cracking from expanding from the scribe line to the integrated circuits. Moreover, the die seal ring could also block water vapor from entering as well as chemical damages such as diffusion of acids or contaminants. In current semiconductor technology, dual die seal ring structure has already been developed to resolve more serious cracking issues. Nevertheless, as development of semiconductor industry continues to proceed how to more effective resolve the cracking issue has become an important task in this field.

SUMMARY OF THE INVENTION

A die seal ring structure includes a metal interconnect structure on a substrate, in which the metal interconnect structure includes an inter-metal dielectric (IMD) layer on the substrate and a first metal interconnection disposed in the IMD layer. Preferably, a first side of the first metal interconnection includes a comb-shape portion in a top view, a second side of the first metal interconnection includes a linear line, a third side of the first metal interconnection includes a linear line, and a fourth side of the first metal interconnection includes a linear line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
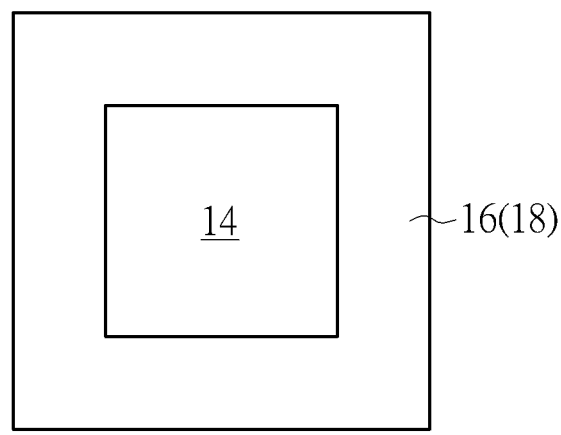
FIG. 1 illustrates a top view of a semiconductor device according to an embodiment of the present invention.
Figure 2:
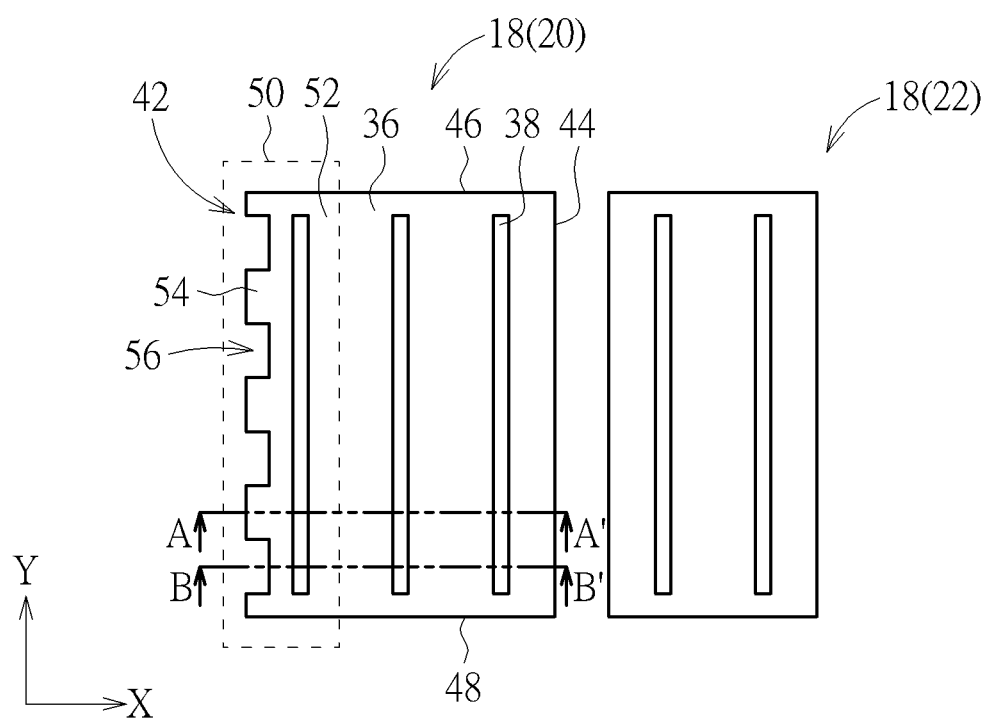
FIG. 2 illustrates an enlarged view of the die seal ring from FIG. 1.
Figure 3:
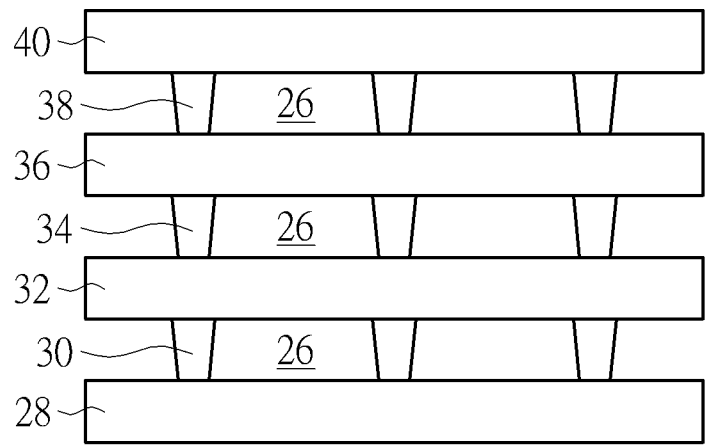
FIG. 3 illustrates a cross-section view of FIG. 2 taken along the sectional line AA'.
Figure 4:
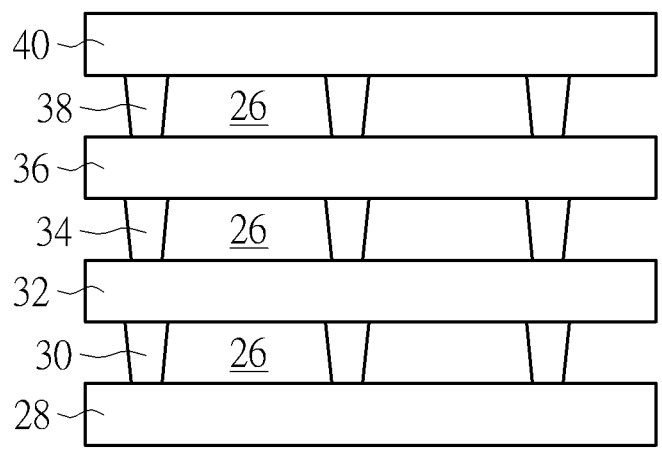
FIG. 4 illustrates a cross-section view of FIG. 2 taken along the sectional line BB'.

Referring to FIGS. 1-4, FIG. 1 illustrates a top view of a semiconductor device according to an embodiment of the present invention, FIG. 2 illustrates an enlarged view of the die seal ring from FIG. 1, FIG. 3 illustrates a cross-section view of FIG. 2 taken along the sectional line AA', and FIG. 4 illustrates a cross-section view of FIG. 2 taken along the sectional line BB'. As shown in FIGS. 1-4, a substrate 12, such as a substrate composed of semiconductor material is provided, in which the semiconductor material could be selected from the group consisting of silicon, germanium, silicon germanium compounds, silicon carbide, and gallium arsenide. Preferably, the substrate 12 includes a die region 14 or an integrated circuit (IC) region and a die seal ring region 16 or peripheral region surrounding the die region 14, in which the die seal ring region 16 could further include one or more die seal ring 18. In this embodiment, the die seal ring 18 preferably includes an inner die seal ring 22 and an outer die seal ring 20 as both die seal rings 22 and 20 surround the die region 14.

Active devices such as metal-oxide semiconductor (MOS) transistors, passive devices, conductive layers, and dielectric layers such as an interlayer dielectric (ILD) layer 24 could also be formed on the die region 14 of the substrate 12. More specifically, planar MOS transistors or non-planar (such as FinFETs) MOS transistors could be formed on the substrate 12, in which the MOS transistors could include transistor elements such as metal gates, source/drain regions, spacers, epitaxial layers, and a contact etch stop layer (CESL), the ILD layer 24 could be formed on the substrate 12 to cover the MOS transistors, and a plurality of contact plugs could be formed in the ILD layer 24 to electrically connect to the gates and/or source/drain regions of MOS transistors. Since the fabrication of planar or non-planar transistors and ILD layer 24 is well known to those skilled in the art, the details of which are not explained herein for the sake of brevity.

Next, metal interconnect structures are formed on the ILD layer 24 to electrically connect the aforementioned contact plugs, in which the metal interconnect structures could include a plurality of inter-metal dielectric (IMD) layers 26 and a plurality of metal interconnections 28, 30, 32, 34, 36, 38, 40 or metal layers embedded in the IMD layers 26. It should be noted that even though seven levels of metal interconnections 28, 30, 32, 34, 36, 38, 40 are disclosed in this embodiment, the number or levels of metal interconnections are not limited to seven but could all be adjusted according to the demand of the process. Preferably, the metal interconnections within the metal interconnect structures include trench conductors and via conductors. For instance, odd level metal interconnections 28, 32, 36, 40 preferably include trench conductors while even level metal interconnections 30, 34, 38 include via conductors, and the metal interconnections 28, 30, 32, 34, 36, 38, 40 are electrically connected to each other and embedded within the IMD layer 26 according to dual damascene processes. Since dual damascene process is well known to those skilled in the art, the details of which are not explained herein for the sake of brevity. In this embodiment, the metal interconnections 28, 30, 32, 34, 36, 38, 40 are preferably made of copper and the IMD layer 26 is made of silicon oxide, but not limited thereto.

As shown from the top view perspective of FIG. 2, the outer die seal ring 20 or more specifically the third level metal interconnection 36 counting from the top of FIG. 3 could include a first side 42 and a second side 44 extending along a vertical direction such as Y-direction and a third side 46 and a fourth side 48 extending along a horizontal direction such as X-direction. Preferably, the first side 42 on the left or the side farther away from the die region 14 includes a comb-shape portion 50 or jagged portion under a top view perspective, the second side 44 closer to the die region 14 includes a linear line under top view perspective, the third side 46 on the top includes a linear line, and the fourth side 48 on the bottom also includes a linear line. In other words, the three sides 44, 46, 48 of the outer die seal ring 20 except the first side 42 all include straight or linear lines. The metal interconnection 38 made of via conductors directly above the metal interconnection 36 on the other hand are disposed extending along the Y-direction.

Viewing from a more detailed perspective, the metal interconnection 36 or the comb-shape portion 50 if viewed under a top view perspective include a main portion 52, a plurality of protruding portions 54 adjacent to the main portion 52, and indentations 56 between the protruding portions 54. Preferably, the sidewall of the protruding portions 54 is aligned with sidewall of adjacent protruding portions 54 along the Y-direction, the protruding portions 54 could have same or different lengths or widths, and indentations 56 could have same or different spacing therebetween. Preferably, the protruding portions 54 having different lengths or widths could mean the sides of protruding portions 54 extending along Y-direction have different lengths and/or widths or the sides of protruding portions 54 extending along X-direction have different lengths and/or widths. It should be noted that even though only one side such as the first side 42 of the metal interconnection 36 includes a comb-shape portion 50, according to other embodiment of the present invention it would also be desirable to form comb-shape portions on more than one side of the outer die seal ring 18 shown in FIG. 1. For instance, two sides, three sides, or even all four sides of the die seal ring 18 could include a comb-shape portion 50 as shown in FIG. 2, which are all within the scope of the present invention.

It should further be noted that even though only a single metal interconnection 36 made of trench conductor and only a single metal interconnection 38 made of via conductor are disclosed in FIG. 1 as the metal interconnection 36 includes a comb-shape portion 50 under a top view perspective, according to other embodiment of the present invention it would also be desirable to extend the comb-shape portion 50 pattern to other level of metal interconnections, in particular the odd number metal interconnections 28, 32, 36, 40 made of trench conductors. For instance, in addition to the fifth level metal interconnection 36 including a comb-shape portion 50, the first level metal interconnection 28, the third level metal interconnection 32, and/or the seventh level metal interconnection 40 could also include similar comb-shape portion 50 depending on the demand of the product, or the first sides 42 of some of the metal interconnections 28, 32, 36, 40 include comb-shape portions 50 while the first sides 42 of some metal interconnections 28, 32, 36, 40 include straight lines as the location of the protruding portions 54 and indentations 56 in the metal interconnections 28, 32, 40 could be the same as or different from the protruding portions 54 and indentations 56 in the metal interconnection 36, which are all within the scope of the present invention.

Figure 5:
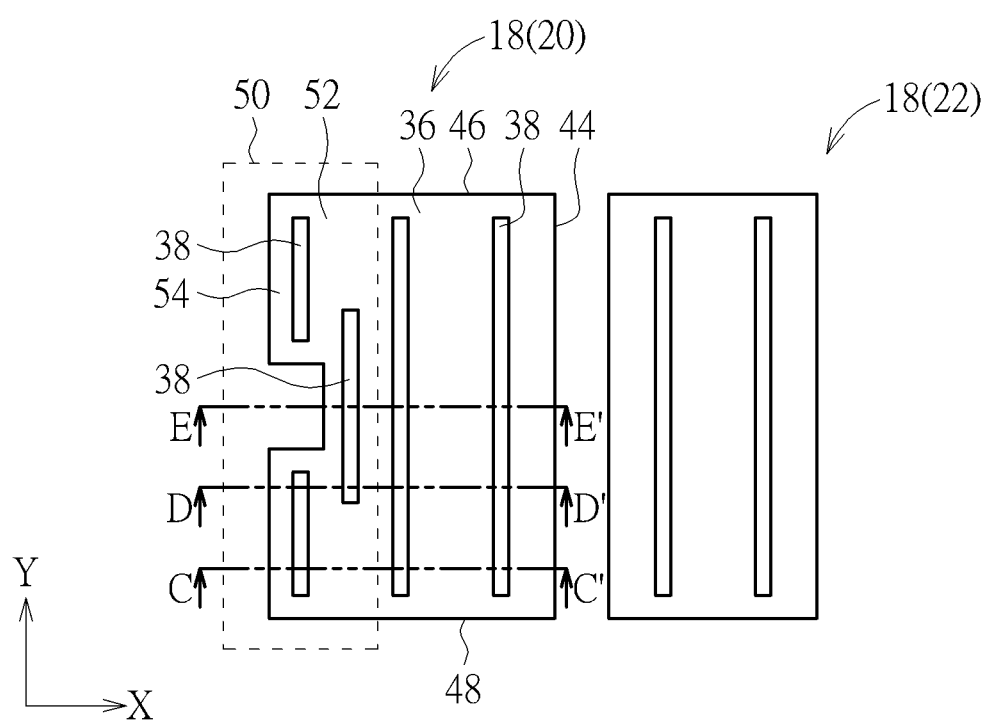
FIG. 5 illustrates a top view of a die seal ring according to an embodiment of the present invention.
Figure 6:
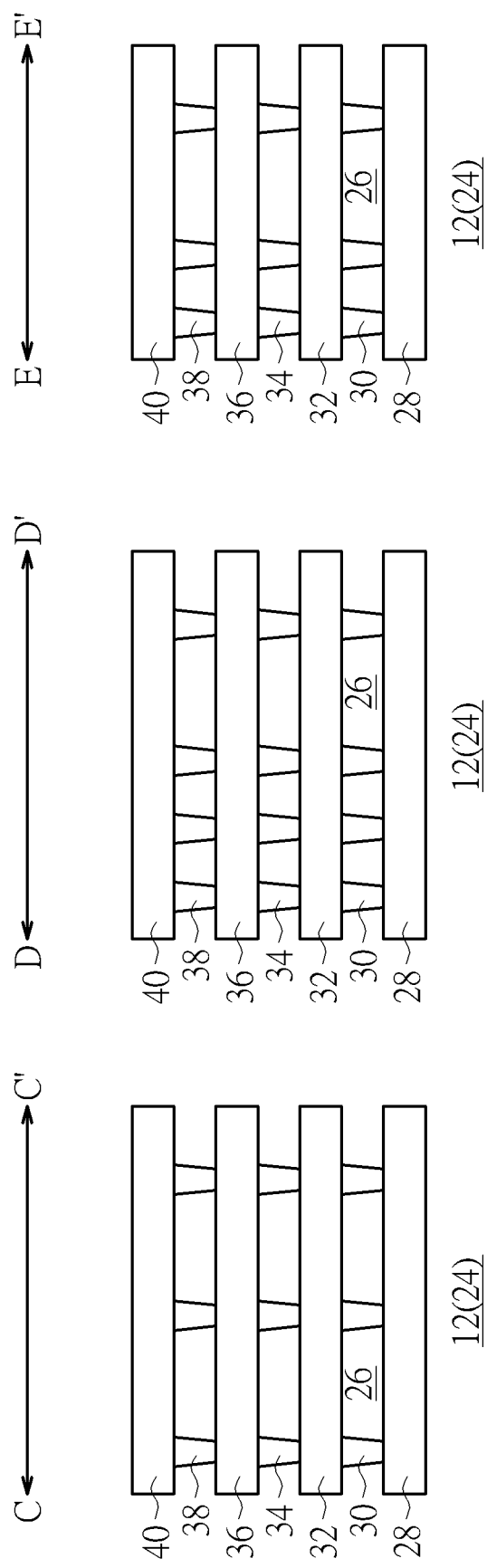
FIG. 6 illustrates a cross-section of FIG. 5 taken along the sectional line CC', DD', and EE'.

Referring to FIGS. 5-6, FIG. 5 illustrates a top view of a die seal ring according to an embodiment of the present invention and FIG. 6 illustrates a cross-section of FIG. 5 taken along the sectional line CC', DD', and EE'. As shown in FIGS. 5-6, in contrast to the metal interconnections 38 made of via conductors all share same lengths and the metal interconnections 38 not overlapping the protruding portions 54 in the aforementioned embodiment, the metal interconnections 38 in this embodiment overlap the protruding portions 54 as the metal interconnections 38 also include different lengths therebetween, in which the length of the metal interconnections 38 overlapping the protruding portions 54 is slightly less than the length of each protruding portion 54 extending along Y-direction while the length of the metal interconnections 38 disposed on the main portion 52 is slightly greater than the length of each protruding portion 54.

Figure 7:
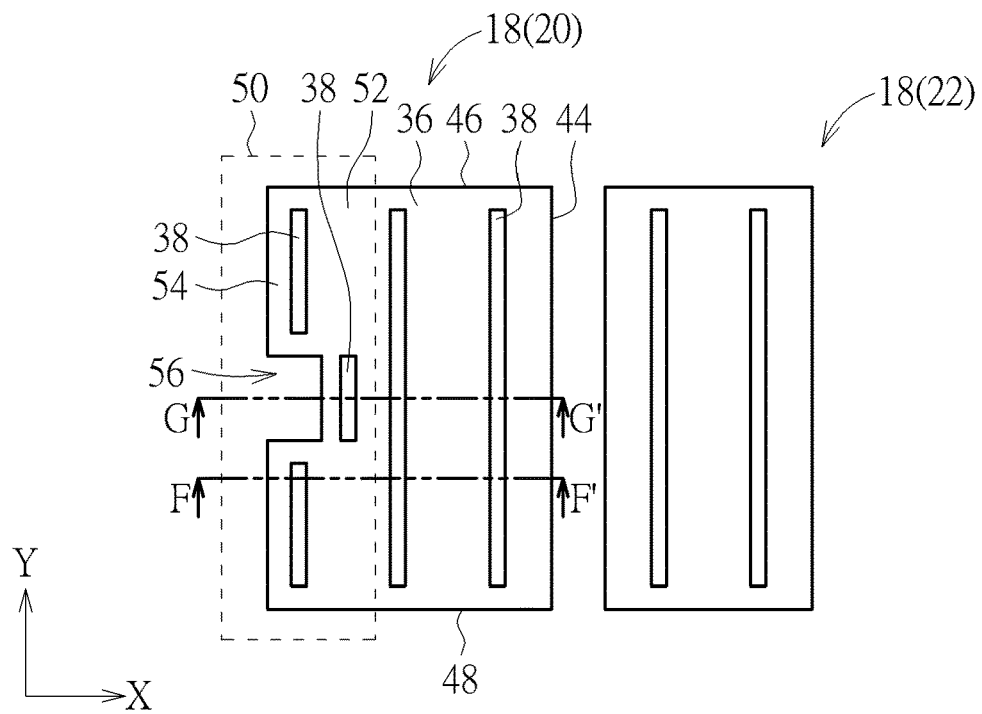
FIG. 7 illustrates a top view of a die seal ring according to an embodiment of the present invention.
Figure 8:
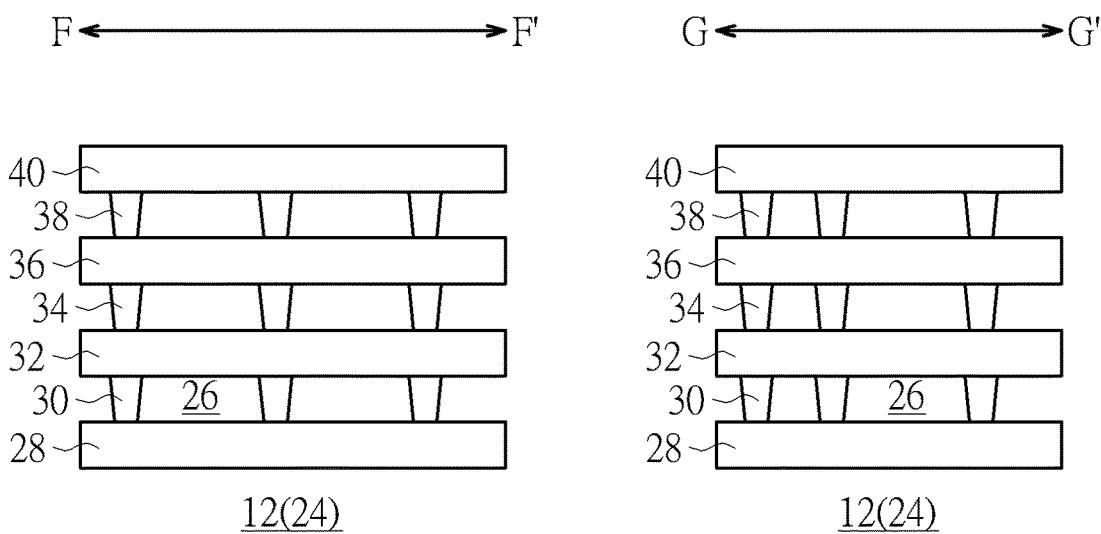
FIG. 8 illustrates a cross-section of FIG. 7 taken along the sectional line FF' and GG'.

Referring to FIGS. 7-8, FIG. 7 illustrates a top view of a die seal ring according to an embodiment of the present invention and FIG. 8 illustrates a cross-section of FIG. 7 taken along the sectional line FF' and GG'. As shown in FIGS. 7-8, part of the metal interconnections 38 made of via conductors also overlap the protruding portions 54 while the metal interconnections 38 include different lengths therebetween. Preferably, the length of part of the metal interconnections 38 overlapping the protruding portion is less than the length of each protruding portion 54 extending along Y-direction while the length of the metal interconnections 38 on the main portion 52 could be greater than or less than the length of the protruding portion 54. For instance, the length of the shortest metal interconnection 38 on the main portion 52 is less than the length of the protruding portion 54 extending along Y-direction and less than or equal to the gap of the indentation 56 extending along Y-direction.

Overall, the present invention discloses an outer die seal ring disposed around the die region or integrated circuits, in which the die seal ring includes a plurality of IMD layers and a plurality of metal interconnection embedded in the IMD layers and at least one side of the metal interconnection or die seal ring farther away from the die region includes a comb-shape portion in a top view perspective. Specifically, the comb-shape portion could include a jagged or serrated edge with a plurality of protruding portions and indentations between the protruding portions, and except the side away from the die region having comb-shape portion, the other sides of die seal ring closer to the die region are preferably straight line edges not having any comb-shape structure. By forming a comb-shape structure on the edge of the die seal ring, die cracking issue caused by serious stress could be minimized effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a die region and a die seal ring region defined on a substrate, wherein the die seal ring region surrounds the die region, the die seal ring region comprises an inner die seal ring and an outer die seal ring and the outer die seal ring comprises a metal interconnect structure on the substrate, wherein the metal interconnect structure comprises:
    an inter-metal dielectric (IMD) layer on the substrate;
    a first metal interconnection in the IMD layer, wherein a first side of the first metal interconnection comprises a comb-shape portion facing away from the die region in a top view, a second side of the first metal interconnection comprises a linear line, a third side of the first metal interconnection comprises a linear line, a fourth side of the first metal interconnection comprises a linear line, the first side and the second side are extending along a same direction, the third side and the fourth side are extending along the same direction, the third side is directly connected to the first side and the second side, and the fourth side is directly connected to the first side and the second side;

a second metal interconnection on the first metal interconnection, wherein the second metal interconnection extends along the linear line of the second side in a top view; and a third metal interconnection on the first metal interconnection, wherein the third metal interconnection extends along the linear line of the second side in a top view and both the second metal interconnection and the third metal interconnection overlap the first metal interconnection entirely.

2. The semiconductor structure of claim 1, wherein the comb-shape portion comprises:

a main portion;

a first protruding portion adjacent to the main portion;

a second protruding portion adjacent to the main portion; and an indentation between the first protruding portion and the second protruding portion.

3. The semiconductor structure of claim 2, wherein a sidewall of the first protruding portion is aligned with a sidewall of the second protruding portion.

4. The semiconductor structure of claim 2, further comprising the second metal interconnection in the IMD layer and on the first metal interconnection.

5. The semiconductor structure of claim 4, wherein the second metal interconnection overlaps the first protruding portion.

6. The semiconductor structure of claim 4, wherein the second metal interconnection comprises a via conductor.

* * * * *